(12) United States Patent
Rouaissia

(10) Patent No.: US 12,332,092 B2
(45) Date of Patent: Jun. 17, 2025

(54) DRIFT SUPPRESSION METHOD, PROXIMITY SENSOR AND WIRELESS DEVICE

(71) Applicant: Semtech Corporation, Camarillo, CA (US)

(72) Inventor: Chaouki Rouaissia, Neuchâtel (CH)

(73) Assignee: Semtech Corporation, Camarillo, CA (US)

( * ) Notice: Subject to any disclaimer, the term of this patent is extended or adjusted under 35 U.S.C. 154(b) by 269 days.

(21) Appl. No.: 18/138,997

(22) Filed: Apr. 25, 2023

(65) Prior Publication Data

US 2023/0349731 A1 Nov. 2, 2023

Related U.S. Application Data

(60) Provisional application No. 63/335,524, filed on Apr. 27, 2022.

(51) Int. Cl.
*G01D 5/24* (2006.01)
*G01R 27/26* (2006.01)

(52) U.S. Cl.
CPC .......... *G01D 5/24* (2013.01); *G01R 27/2605* (2013.01)

(58) Field of Classification Search
CPC ........ G01R 27/00; G01R 27/02; G01R 27/26; G01R 27/2605; G01D 5/00; G01D 5/12; G01D 5/14; G01D 5/24; H03K 17/00; H03K 17/94; H03K 17/945; H03K 17/955; H03K 2217/00; H03K 2217/94; H03K 2217/9401; H03K 2217/94026; H03K 2217/94031; H03H 17/00; H03H 17/02; H03H 17/06; H03H 2017/0072; H03H 2017/0081; G01V 3/00
USPC ................................ 324/600, 649, 658, 686
See application file for complete search history.

(56) References Cited

U.S. PATENT DOCUMENTS

| | | |
|---|---|---|
| 10,136,399 B1 | 11/2018 | Rouaissia |
| 10,298,280 B2 | 5/2019 | Nys et al. |
| 10,423,278 B2 | 9/2019 | Rouaissia |
| 10,538,280 B2 * | 1/2020 | Magee ............... B60B 1/00 |
| 11,893,959 B2 * | 2/2024 | Kim ................... G09G 5/10 |
| 2018/0329575 A1 | 11/2018 | Rouaissai |
| 2019/0383065 A1 | 12/2019 | Spick |
| 2021/0083664 A1 | 3/2021 | Rouaissia et al. |
| 2024/0364092 A1 * | 10/2024 | Tsai .................... H02H 3/44 |

FOREIGN PATENT DOCUMENTS

DE 102014212355 A1 * 12/2014 ........... G06F 3/0418

* cited by examiner

*Primary Examiner* — Hoai-An D. Nguyen
(74) *Attorney, Agent, or Firm* — Blank Rome LLP

(57) ABSTRACT

A portable device including a capacitive proximity sensor can suppress a drift superimposed to the capacitive proximity signal and the corresponding method. A processor generates a baseline value by integrating a series of values that are derived from the slope of the proximity signal, when the slope is within stated limits, or a fixed value outside of the stated limits.

16 Claims, 2 Drawing Sheets

DRIFT SUPPRESSION METHOD, PROXIMITY SENSOR AND WIRELESS DEVICE

The present application claims the benefits of prior date of U.S. provisional application 63/335,524 of Apr. 27, 2022, the contents whereof are hereby incorporated by reference.

TECHNICAL DOMAIN

The present invention concerns a filter arranged to suppress a slow drift from a signal representing a quantity of interest. Embodiments of the invention relate to a digital implementation of the aforesaid drift suppression filter, and to a proximity detector that uses the aforesaid filter to discriminate between a legitimate signal, for example the approach of a person, and a drift generated by temperature variations or any other reason. These are not, however, the only applications of the invention.

RELATED ART

In several measuring and sensing applications, relevant information is carried by an electric value (i.e., a voltage or a current) that represents a quantity of interest, to which is superposed a spurious value that may be constant or drifting slowly. Since the presence of the spurious baseline is a limit to the sensitivity and precision of the measure, a number of algorithms and filters have been devised to eliminate it from the signal of interest.

Capacitive proximity detectors are used in many modern portable devices, including mobile phones and tablets, to determine whether the device is close to a body part of a user. This information is important in several ways: it is used to detect whether the telephone is being actively manipulated by a user, and whether the user is looking at the display, in which case the information displayed can be adapted, and/or the device switch from a low power state to an active one. Importantly, this information is used to adapt the power level of the radio transmitter to comply with body dose limits. Capacitive proximity detection is used also in touch-sensitive displays and panels.

Capacitive proximity detection depends critically on drift suppression. Typically, the capacity of the approaching user's body, seen from an electrode on the device, is many times smaller than the background capacity of the electrode itself. This background value and its fluctuations would totally mask the proximity signal, were they not eliminated.

Supposing that the signal that must be measured varies much faster than the drifts in the baseline, the latter can be suppressed by a straightforward high-pass filter. In some cases, the same result is obtained by computing a running average value of the signal, that is taken to represent the drift, and subtracting it from the original signal. FIG. 1, which will be discussed later, shows a digital implementation of this drift-suppression process that is in use in capacitive proximity detectors, provided unit 60 implements a straightforward running average.

In many real cases, however, this simple approach is not sufficient. Drift suppressors tend to reduce the desired signal as well as the drift, particularly when the signal of interest varies gradually, such as it would be the case—in a portable device—of a user approaching quite slowly to the proximity sensor.

U.S. Pat. Nos. 10,136,399B1, 10,423,278B2, 10,298,280B2 and US2021/0083664A1 disclose capacitive detectors providing proximity-awareness in a portable device, such as a portable phone, and various circuits and algorithms used to process the signal accounting for background and drift.

SHORT DISCLOSURE OF THE INVENTION

The present invention proposes a method of removing a drift from a proximity signal that is suitable for portable devices equipped with capacitive proximity sensors but could be applied usefully to other uses. A capacitive sensor is also part of the invention, as well as a portable device so equipped.

With respect to other known solutions, the proximity sensor of the invention exhibits a significantly better immunity against drift and is therefore less sensitive to temperature changes. It retains its efficacity in detecting proximity even if the approach is very slow.

According to the invention, these aims are attained by the object of the attached claims.

SHORT DESCRIPTION OF THE DRAWINGS

Exemplar embodiments of the invention are disclosed in the description and illustrated by the drawings in which.

EXAMPLES OF EMBODIMENTS OF THE PRESENT INVENTION

Figure 1:
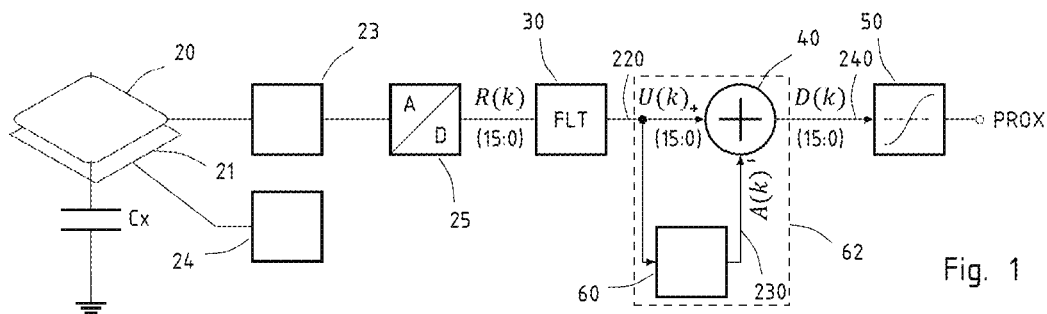
FIG. 1 illustrates schematically a capacitive proximity sensor with a digital drift-suppression filter.

FIG. 1 shows schematically a capacitive proximity sensor with a drift-suppression processor. For the sake of concision, the present description will refer to a capacitive proximity detector in a portable phone or tablet, but the filter and the method of the invention could be applied to diverse fields.

The detector is sensitive to the capacitance Cx of an electrode 20 that will increase slightly at the approach of a user's hand, face or body. As already discussed, the variations due to body proximity are overshadowed by the own capacity of the electrode which, in turn, is not stable. The capacity signal preferably amplified and processed by an analogue processor 23, which may also subtract a programmable offset, and converted into raw digital values by an A/D converter 25. The samples R(k) may be encoded as 16 bits integers, or in any other suitable format.

The device represented in FIG. 1 has also, although this is not essential, a shield electrode 21 below the sense electrode 20. The shield electrode may be connected to a shield control unit 24 that generates a voltage identical to or closely following the potential of the sense electrode 20. In this manner, the shield electrode 21 protects the sense electrode 20 from the conductors below, a potential source of disturbances, without contributing significantly to the measured capacitance.

The raw samples R(k) contain also, in a non-ideal world, noise and unwanted disturbances that are attenuated by a filter 30. The filter 30 may be a digital low-pass filter, dimensioned in consideration of the bandwidth of the expected signal, or any other suitable filter. The filter 30 provides a series of samples U(k) useful for the processing in the successive stages.

Although the filter 30 is represented as a simple block to simplify the drawing, it may in fact comprise several processor units for reducing noise. It may include FIR low-pass filter, IIR low-pass filter, and nonlinear algorithm, according to the need. It has been found that the part of the signal that is most significant for the purpose of controlling the functions of a portable phone, for example, falls within a spectrum of frequency of a few Hertz.

Block 62 represents a drift suppression unit that is used to estimate and suppress the drift, be it of thermal nature or otherwise, superimposed to the capacity variations. Unit 60 is a baseline estimator that generates a digital signal A(k) that approximate the instantaneous value of the baseline, which is supposed to be an effect of the drift. The baseline is subtracted digitally from the proximity signal U(k) and the result is the drift-suppressed signal D(k). A discriminator 50 then generates a flag signal 'PROX' that indicates the proximity of the user's hand, face or body. The invention is not limited to a binary output, however. In variants, the decision unit 50 may be a multi-level discriminator that generates a several flags, according to the level of proximity, or any other useful variable. The output of the detector needs not be materialized in an output terminal: the flag may be encoded in a value stored in a register of the proximity sensor that is accessible through a communication bus, such as $I^2C$ or SPI.

The various block making up the proximity sensor are represented separate and distinct in the drawing but should in fact be interpreted as functional units. In a practical implementation, they may be realized in part or completely in software and may share code and data resources.

The capacitive proximity sensor may be part of a cell-phone, a laptop, a tablet, or another connected portable device. In this case, the capacitive electrode 20 could serve also as RF antenna, be a part of a metallic chassis of the phone, or simply a copper area on a PCB.

Figure 2:
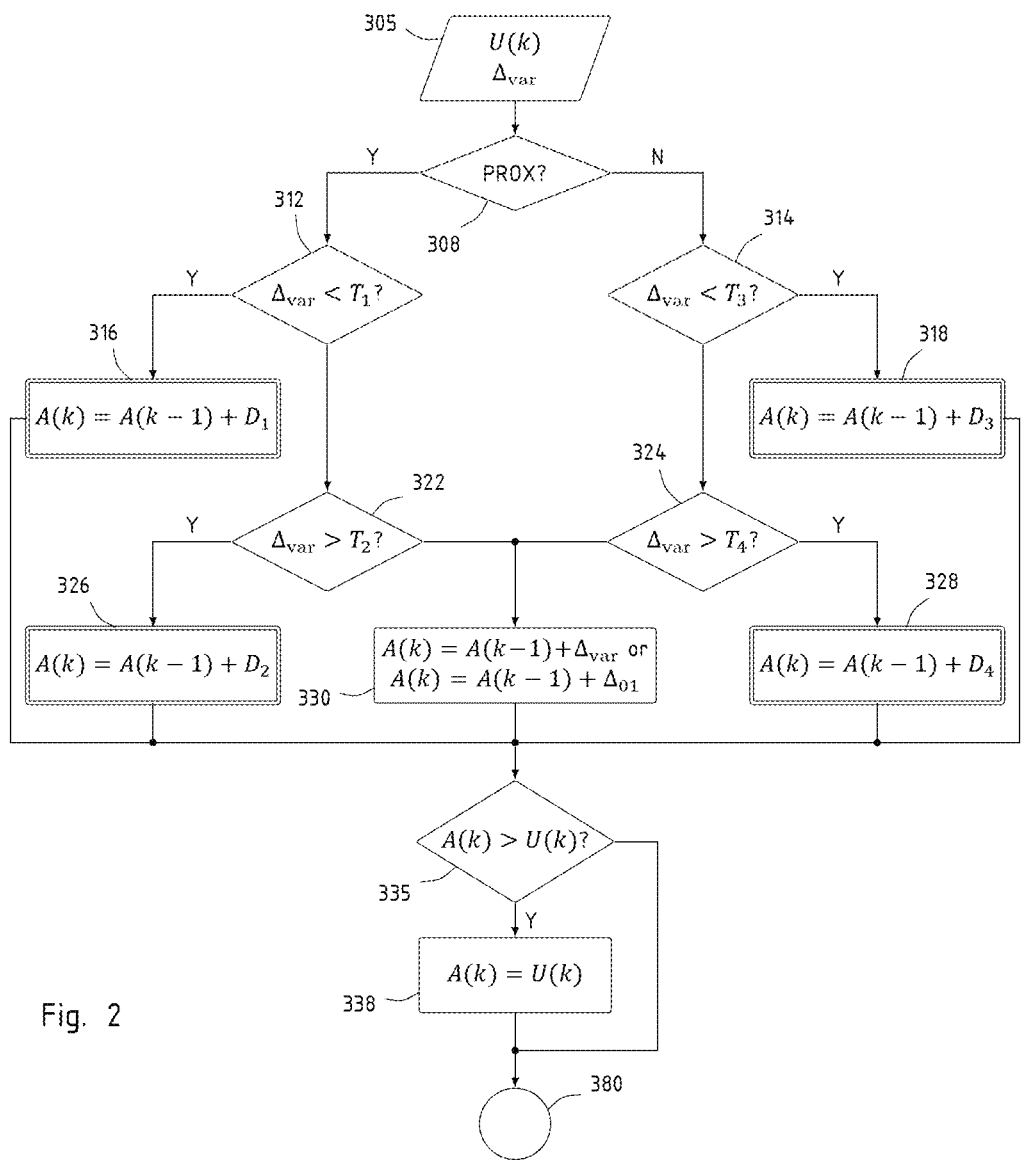
FIG. 2 illustrates with a flowchart, a method of suppressing a drift according to an aspect of the invention.

The generation of the baseline signal A(k) will now be explained referring do FIG. 2.

An important aspect of the method of the invention is the estimation of the variation of the useful signal $U_n$. The variation is represented by a quantity $\Delta_{var}$ that is preferably computed at each new useful sample U(k) (step 305). A possible manner of estimating the variation of U(k) is the difference between a sample and the preceding one, $\Delta_{01}=U(k)-U(k-1)$ or a running average $\Delta_{var}$ of the differences U(k)-U(k-1) in a suitable window, for example the last N received samples of U(k):$\Delta_{var}=(U(k)-U(k-N-1))/N$ where N may take any suitable value, for example N=8. At the step 305 the method of the invention receives a new value of the useful signal U(k) and computes or receives a corresponding new value of $\Delta_{var}$.

Step 308 checks whether the proximity flag is raised, i.e. there have been indications that a conductive body is nearby. If the result of this test is positive, the method tests (step 130) whether the variation $\Delta_{var}$ is in a predetermined region of acceptation. In the example, $\Delta_{var}$ is compared (step 312) with an upper threshold $T_1$ which will be, in most cases, positive and, (step 322) with a lower threshold $T_2$ that may be negative.

If the PROX flag is not asserted, the method follows the right branch from the test 308, which is completely symmetrical to the left one. The variation $\Delta_{var}$ is compared (314) with an upper threshold $T_3$ which will be, in most cases, positive and, (324) with a lower threshold $T_4$ that may be negative. Numerically, $T_3$ may differ from $T_1$ and $T_4$ from $T_2$, or they could be equal. Advantageously, this symmetrical processing avoids that strongly negative variations (for example, when the user suddenly moves away from the sensor) are not detected.

If $\Delta_{var}$ is neither above the upper threshold nor below the lower one, no matter whether the proximity flag is asserted or not, the value of the baseline is incremented (step 330) by a value derived from the proximity signal. Preferably, the increment will be a value related to the slope, or derivative of the proximity signal such that the successive increments yield back, by integration, the original shape. In a possible variant, the baseline signal A(k) is incremented by the average slope signal $\Delta_{var}$. Alternatively, the baseline signal is incremented by the instantaneous slope $\Delta_{01}=U(k)-U(k-1)$. Other expressions are possible, however.

If $\Delta_{var}$ is above the upper threshold or below the lower one, the baseline is incremented by a fixed amount, irrespective of the values of U(k) and $\Delta_{var}$. This takes place in one of the cells 316, 326, 318, 328, according to the sign of the exceeded threshold and the flag state. The operation that is done is always the same, but the value of the fixed amount $D_1, D_2, \ldots, D_4$ may be different.

It is important to reset the value of the baseline A(k) to that of the proximity signal U(k) from time to time. It was found advantageous to do this operation whenever the value of the baseline exceeds that of the proximity signals (cells 335 and 338).

Figure 3:
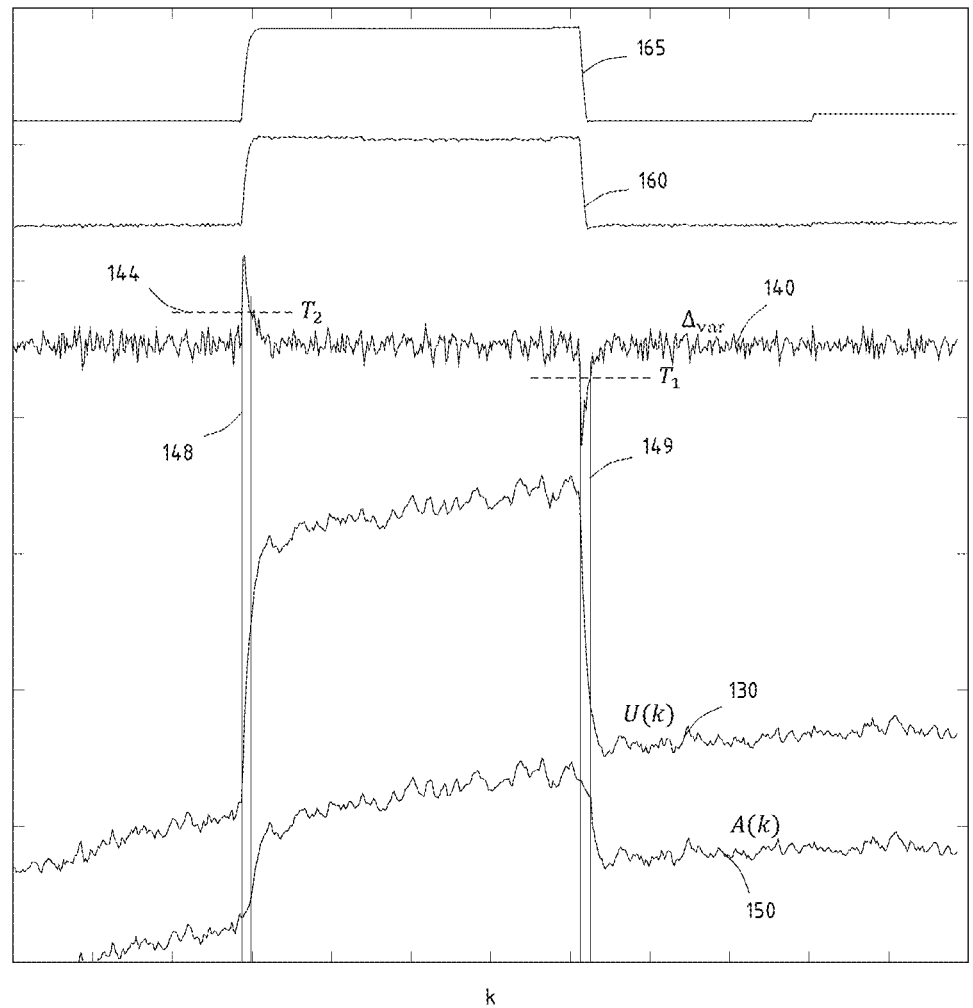
FIG. 3 is a plot of some signals used in the invention.

FIG. 3 shows a conceptual simulation of important signals in the processor and in the method of the invention. Each plot is to scale, but the units of the vertical axis are not the same for all plots. The plots may have been resized and shifted vertically by arbitrary amounts to fit in the figure. The horizontal axis (showing time or sample index) is common, though, and the temporal relationships between plots are respected. The time axis may cover a span of several seconds, in a real case.

Plot 130 is the proximity signal U(k) coming from the filter unit 30. It exhibits a steeply rising step, indicating a conductive body approaching the sensor, followed by a falling step after some time, showing that the conductive body has been moved away. This pattern of proximity is superposed to a slowly changing baseline, as it may be due to a thermal drift. Plot 140 is the corresponding average slope $\Delta_{var}$ taken on a window of 8 samples. The rising and falling steps are marked in this plot by a positive and a negative peak.

The threshold values $T_2$ and $T_1$ are marked by the dashed line 144. Inside the intervals 148, 149, the baseline signal A(k) is incremented by fixed values and has a linear slope, except when it is limited by the intervention of the reset test (335, 338 in FIG. 2). Elsewhere, the baseline is incremented by the average slope $\Delta_{var}$ (as seen in plot 150) or by the instantaneous slope $\Delta_{01}$ (as seen in plot 155) and follows closely the variations of the proximity signal U(k).

Subtracting the baseline from the proximity signal provides a drift-suppressed signal. Plot 160 is the result of this suppression when the baseline is incremented by the average slope $\Delta_{var}$. Plot 165 is the same when the baseline is incremented by the instantaneous slope $\Delta_{01}$. The former retains some noise, due the finite resolution of the numeric algorithm, while the latter is very close to a square signal, with minimal noise.

Note that this tracking method may improve by using a debouncer and/or a limiter on the signals to avoid the occurrence of very large values of $\Delta_{01}$ when $\Delta_{var}$ transiently crosses the ~0 value, for example during fast taps.

In a portable wireless device, the sensor and method disclosed herein can be used advantageously to detect when the device is brought close, for example to the user's head. In such cases, the device can be configure to take specific actions, for example: switching off a display, inhibiting a tactile input, adapting a radio transmission power.

REFERENCE SIGNS 20 sense electrode
21 active shield
23 analogue front/end, amplifier
24 shield controller
25 A/D converter
30 filter
40 adder
50 discriminator
60 baseline extractor
62 drift suppression unit
139 proximity signal
140 variation
144 threshold line
148 not tracking interval
149 not tracking interval
150 baseline signal
155 baseline signal
160 drift-corrected signal, by $\Delta_{var}$.
165 drift-corrected signal, by $\Delta_{01}$.
220 proximity signal
230 baseline signal
240 drift-corrected signal
305 new values
308 proximity flag test
312 upper threshold
314 upper threshold
316 fixed increment
318 fixed increment
322 lower threshold
324 lower threshold
326 fixed increment
328 fixed increment
330 tracking
335 test
338 reset

The invention claimed is:

1. A method of suppressing a drift superimposed to a proximity signal generated by a capacitive sensor, the method including:
receiving a series of samples of the proximity signal,
computing repeatedly an average slope of the proximity signal from the received samples
comparing the average slope with a threshold,
updating a baseline value by adding a value derived from the proximity signal when the average slope is below the threshold or a fixed value when the average slope is above the threshold,
obtain a drift-suppressed proximity signal by subtracting the baseline value from the proximity signal.

2. The method of claim 1, wherein, in the comparison of the average slope with the threshold, the average slope is compared with an upper threshold and with a lower threshold, and in the updating of the baseline value, the added value is derived from the proximity signal when the average slope is between the upper and lower thresholds, is a first fixed value when the average slope is below the lower threshold, and a second fixed value when the average slope is above the upper threshold.

3. The method of claim 1, wherein the value derived from the proximity signal is an instantaneous slope of the proximity signal or the average slope of the proximity signal.

4. The method of claim 1, comprising a step of comparing the baseline value against the proximity signal and setting the baseline value equal to the proximity signal if the baseline value goes above the proximity signal.

5. The method of claim 2, comprising a step of comparing the drift-suppressed proximity signal with a proximity threshold to generate a logic proximity flag, wherein the values of the upper threshold and/or of the lower threshold and/or of the first fixed value and/or of the second fixed value are altered when the proximity flag is raised and set back to a previous value when the proximity flag is lowered.

6. The method of claim 2, wherein the first fixed value and/or the second fixed value are positive, zero or negative.

7. A capacitive proximity sensor for a portable device, comprising a sense electrode and a readout circuit configured to read a self-capacitance of the sense electrode and provide a proximity signal including a series of capacitance values, the capacitive proximity sensor comprising a drift suppression unit configured to suppressing a drift superimposed on the proximity signals by the steps of:
computing repeatedly an average slope of the proximity signal from the capacitance values
comparing the average slope with a threshold,
updating a baseline value by adding a value derived from the proximity signal when the average slope is below the threshold or a fixed value when the average slope is above the threshold,
obtain a drift-suppressed proximity signal by subtracting the baseline value from the proximity signal.

8. The proximity sensor of claim 7, wherein, in the comparison of the average slope with the threshold, the average slope is compared with an upper threshold and with a lower threshold, and in the updating of the baseline value, the added value is derived from the proximity signal when the average slope is between the upper and lower thresholds, is a first fixed value when the average slope is below the lower threshold, and a second fixed value when the average slope is above the upper threshold.

9. The proximity sensor of claim 7, wherein the value derived from the proximity signal is an instantaneous slope of the proximity signal or the average slope of the proximity signal.

10. The proximity sensor of claim 7, the processor being configured for comparing the baseline value against the proximity signal and setting the baseline value equal to the proximity signal if the baseline value goes above the proximity signal.

11. The proximity sensor of claim 8, the processor being configured for comparing the drift-suppressed proximity signal with a proximity threshold to generate a logic proximity flag, wherein the values of the upper threshold and/or of the lower threshold and/or of the first fixed value and/or of the second fixed value are altered when the proximity flag is raised and set back to a previous value when the proximity flag is lowered.

12. The proximity sensor of claim 8, wherein the first fixed value and/or the second fixed value are positive, zero or negative.

13. A portable wireless device comprising a proximity sensor having sense electrode and a readout circuit configured to read a self-capacitance of the sense electrode and provide a proximity signal including a series of capacitance values, the capacitive proximity sensor comprising an electronic processor configured to suppressing a drift superimposed on the proximity signals by the steps of:
computing repeatedly an average slope of the proximity signal from the capacitance values comparing the average slope with a threshold,
updating a baseline value by adding a value derived from the proximity signal when the average slope is below the threshold or a fixed value when the average slope is above the threshold,
obtain a drift-suppressed proximity signal by subtracting the baseline value from the proximity signal.

14. The portable wireless device of claim 13, the processor being configured for comparing the drift-suppressed proximity signal with the proximity threshold to generate a logic proximity flag, wherein the portable wireless device is configured to take a specific action when the logic proximity flag is asserted.

15. The portable wireless device of claim 14, wherein the action is one of: reducing a transmission power of a wireless data interface, switching off or reducing the luminosity of a display, inhibiting a tactile input.

16. The portable wireless device of claim 13, wherein, in the comparison of the average slope with the threshold, the average slope is compared with an upper threshold and with a lower threshold, and in the updating of the baseline value, the added value is derived from the proximity signal when the average slope is between the upper and lower thresholds, is a first fixed value when the average slope is below the lower threshold, and a second fixed value when the average slope is above the upper threshold, wherein the values of the upper threshold and/or of the lower threshold and/or of the first fixed value and/or of the second fixed value are altered when the proximity flag is raised and set back to a previous value when the proximity flag is lowered.

* * * * *